United States Patent [19]

Oelsch

[11] Patent Number: 4,527,030
[45] Date of Patent: Jul. 2, 1985

[54] KEYBOARD

[75] Inventor: Jürgen Oelsch, Salz, Fed. Rep. of Germany

[73] Assignee: Preh Elektrofeinmechanische Werke, Jakob Preh Nachf., GmbH & Co., Bad Neustadt, Fed. Rep. of Germany

[21] Appl. No.: 555,034

[22] Filed: Nov. 22, 1983

Related U.S. Application Data

[63] Continuation-in-part of Ser. No. 315,751, Oct. 28, 1981, abandoned.

[30] Foreign Application Priority Data

Nov. 6, 1980 [DE] Fed. Rep. of Germany ....... 3041859

[51] Int. Cl.$^3$ ............................................. H01H 13/04
[52] U.S. Cl. .................................. 200/306; 200/5 A; 200/159 B
[58] Field of Search ................... 200/159 B, 306, 267, 200/268, 5 A, 292, 340, 86 R, 86.5; 361/398, 409, 410

[56]         References Cited
        U.S. PATENT DOCUMENTS

| | | | |
|---|---|---|---|
| Re. 28,365 | 3/1975 | Brave ................. | 200/86 R |
| 3,643,041 | 2/1972 | Jackson ............... | 200/5 A |
| 3,668,356 | 6/1972 | Kekas ................. | 200/340 X |
| 3,829,646 | 8/1974 | Lorteije et al. ....... | 200/159 B |
| 3,911,234 | 10/1975 | Kotaka ................ | 200/5 A |
| 3,917,917 | 11/1975 | Murata et al. ......... | 200/5 A |
| 3,932,722 | 1/1976 | Obata et al. .......... | 200/159 B X |
| 3,995,128 | 11/1976 | Hawkins ............... | 200/5 A |
| 4,028,509 | 6/1977 | Zurcher ............... | 200/5 A |
| 4,033,030 | 7/1977 | Robinson et al. ....... | 200/159 B X |
| 4,045,636 | 8/1977 | Yoder et al. .......... | 200/292 |
| 4,046,981 | 9/1977 | Johnson et al. ........ | 200/159 B |
| 4,066,851 | 1/1978 | White et al. .......... | 200/5 A |
| 4,074,088 | 2/1978 | Keough et al. ......... | 200/5 A |
| 4,081,898 | 4/1978 | Taylor, Jr. et al. .... | 200/159 B X |
| 4,083,100 | 4/1978 | Flint et al. .......... | 200/159 B X |
| 4,085,306 | 4/1978 | Dunlap ................ | 200/292 X |
| 4,180,711 | 12/1979 | Hirata et al. ......... | 200/5 A |
| 4,287,394 | 9/1981 | Hargita et al. ........ | 200/5 A |
| 4,314,114 | 2/1982 | Larson ................ | 200/5 A |
| 4,349,712 | 9/1982 | Michalski ............. | 200/159 B |
| 4,354,068 | 10/1982 | Sobol ................. | 200/5 A |
| 4,365,130 | 12/1982 | Christensen ........... | 200/306 |
| 4,366,355 | 12/1982 | Oelsch ................ | 200/159 B |
| 4,918,257 | 11/1983 | Muller et al. ......... | 200/159 B |

FOREIGN PATENT DOCUMENTS

| | | |
|---|---|---|
| 1806241 | 8/1969 | Fed. Rep. of Germany . |
| 1814805 | 10/1970 | Fed. Rep. of Germany . |
| 7624175 | 11/1976 | Fed. Rep. of Germany . |
| 2538563 | 3/1977 | Fed. Rep. of Germany . |
| 2945707 | 6/1980 | Fed. Rep. of Germany . |
| 3033134 | 5/1981 | Fed. Rep. of Germany ...... 200/340 |
| 2280964 | 2/1976 | France ................ 200/340 |
| 2058462 | 4/1981 | United Kingdom ........... 200/159 B |

Primary Examiner—Stephen Marcus
Assistant Examiner—Ernest G. Cusick
Attorney, Agent, or Firm—Woodcock Washburn Kurtz Mackiewicz & Norris

[57]         ABSTRACT

A keyboard comprising a flexible-foil printed circuit in which an insulating foil or sheet substrate is provided with printed conductors and contact surfaces, in which the insulating foil sheet is provided with holes, and which includes a plurality of press buttons or keys associated with the contact surfaces, each key comprising an elastically deformable snap-action element which is adapted to be deformed upon actuation by means of an actuating button in order to bring the contact element into contact with the contact surface.

The flexible-foil printed circuit comprises an insulating foil substrate having a thickness not exceeding 0.6 mm which is provided on both sides with printed conductors and on one side with electrical contact surfaces and/or contact elements. The conductors may be formed in separate printing steps for each side of the foil or sheet. Contacts extending through the holes in the substrate may be produced by means of the printing step itself during the printing of the conductors.

6 Claims, 10 Drawing Figures

KEYBOARD

This application is a continuation-in-part of U.S. patent application Ser. No. 315,751, filed Oct. 28, 1981 now abandoned.

FIELD OF THE INVENTION

This invention relates to a keyboard comprising a flexible printed circuit and an insulating sheet. Holes in the insulating sheet allow contact to be made with contact surfaces on the printed circuit upon pressing buttons or keys associated with the contact surfaces. Each key assembly comprises an elastically deformable snap-action element which is adapted to be deformed upon actuation by means of an actuating button so as to bring said contact element into contact with said contact surface.

BACKGROUND OF THE INVENTION

The general tendency of the industry to employ digital techniques in preference to analog techniques and to substitute software for hardware has resulted in an ever-increasing use of press button switches in the form of single switches or in the form of keyboards comprising a plurality of switches in various fields of electrical engineering, e.g. communications engineering as well as in so-called terminals or data inputting devices. There have been suggested a large variety of keyboard structures, the function of which depends on a variety of principles, such devices constituting the interface between man and machinery. The dependability of such press button switches as well as the nature of the contact established between man and machinery is greatly influenced by the characteristics of the key stroke. Besides so-called low or membrane keyboards in which the stroke length amounts to up to approximately 1.5 mm, use is made, depending on the field of application, of keyboards in which a stroke length of between 1.5 and 6.35 mm is employed. In addition to these, keyboards comprising so-called sensor switches are in use. Regardless of the type of keyboard considered, it is desired that the user should be provided with a feedback "feel" indicating to him that the respective key has been actuated.

BRIEF DESCRIPTION OF THE PRIOR ART

In German Offenlegungsschrift DE-OS No. 1 806 241 there has been disclosed a keyboard which comprises a printed circuit board including printed conductors and contact surfaces, the printed circuit board having spaced above it a metallic plate which is provided with embossed dome-like projections. A plate made of insulating material and provided with apertures is disposed between the metallic plate and the printed circuit board. Through the application of finger pressure it is possible to produce an elastic snapping action of any desired projection so as to establish an electric connection between the projection and the contact surface associated therewith and disposed therebelow. In an improved version of this known keyboard, the metallic plate has been replaced by a so-called switching mat made of non-conducting silicone rubber. Such a switching mat is provided with a plurality of dome-shaped projections with which press buttons are adapted to cooperate. In this keyboard, said projections perform the function of some sort of rubber springs. Within the hollow interior of each projection there are disposed suitable small plates which are made of a suitable electrically conducting material such as a conductive silicone rubber. Upon said projections being depressed, said small plates provide an electrically conductive connection to contact surfaces belonging to a printed circuit board. Such a switching mat has, for example, been disclosed in German Offenlegungsschrift DE-OS No. 29 45 707. Said projections are interconnected by ducts permitting the air tending to escape from the respective hollow space upon a projection being depressed to flow to another adjacent hollow space.

In most cases said switching mats have disposed therebeneath printed circuit boards which are provided with printed conductors either on one side or on both sides. In printed circuit boards having printed conductors on both sides, the contacts extending through the circuit board are provided in the form of holes or apertures, the walls of which are metallized by electroless or galvanic plating. It has also been suggested to provide electrically conducting connections extending through the substrate with the aid of a core material of the apertures which is metal-coated on both sides and by means of a suitable solder (German Offenlegungsschrift DE-OS No. 18 14 805).

If it is intended to utilize one side only of a printed circuit board, it is possible to employ insulating layers to separate printed conductors which cross each other. In German Offenlegungsschrift DE-OS No. 25 38 563 there has, for example, been disclosed a thin-film circuit in which printed conductors crossing each other are separated at their intersections by an insulating layer produced by means of a silk screen printing method. This organic insulating layer which permits the use of a silk screen printing method consists of a phenolic or epoxy or silicone resin varnish.

Disclosed in the German Utility Model Specification (DE-GM) No. 76 24 175 is a keyboard in which it is expressly stated that use is made of one side of a printed circuit board only. By means of a silk screen printing process a base plate made of insulating material is provided with contact surfaces and printed conductors. Where it is necessary to use printed conductors crossing each other, a layer of insulating material is printed on the base plate at the intersection. The second printed conductor then extends above the insulating layer. This printed circuit board is covered by an elastic switching mat which is integrally provided with snap-action elements. Provided in the internal cavities of said snap-action elements are electric contact pellets which are adapted to establish an electric connection between the respective contact surfaces upon the snap-action element being depressed.

OBJECTS OF THE INVENTION

It is an object of this invention to provide an improved keyboard of the general type mentioned earlier which permits flexible-foil printed circuits both sides of which are provided with circuit elements to be provided with contacts extending through the foil material, the arrangement being such that said contacts may be made in the simplest possible manner so as to reduce the costs of manufacture.

Another object of the invention is to provide a simplified and improved keyboard structure.

SUMMARY OF THE INVENTION

According to the invention, the objects of the invention are attained by the provision of a flexible-foil printed circuit comprising an insulating foil substrate having a thickness not exceeding 0.6 mm, which is provided on both sides with printed conductors and on one side with contact surfaces and/or contact elements made of at least one electrically conducting compound, use being made of at least one printing step for forming the conductors on each side of the foil or sheet, wherein contacts extending through the apertures of the substrate are also produced in the printing step used to form the printed conductors.

BRIEF DESCRIPTION OF THE DRAWINGS

The invention will be described more specifically hereinafter with reference to preferred embodiments shown in the drawings, in which.

DETAILED DESCRIPTION OF THE PREFERRED EMBODIMENTS

Figure 4:
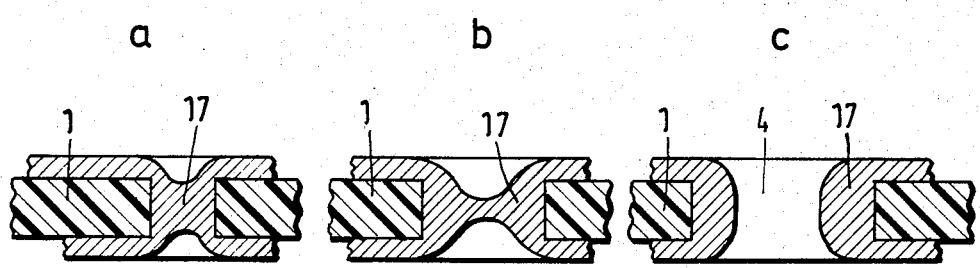
FIGS. 4a, 4b and 4c show enlarged fragmentary cross sections illustrating through-contacts provided in flexible-foil printed circuits and having different diameters.

In the drawings reference number 1 indicates a flexible insulating substrate of a flexible-foil printed circuit which has been provided, by means of a silk screen printing step, with printed conductors 2 and first contact surfaces 3 forming desired patterns. In order to produce the printed circuit, the insulating foil material 1 which may have a thickness not exceeding 0.6 mm is provided with apertures 4 at those points at which it is intended to provide through-contacts at a later time. In another step, one side of the foil material is provided with said printed conductors 2 and said first contact surfaces 3 by applying a compound 17 shown in FIG. 4 adapted to be applied by means of a silk screen printing process. In this step compound 17 flows into apertures 4. Since the thickness of the insulating foil material 1 should not exceed 0.6 mm, at least the edges of apertures 4 will be wetted by compound 17. The first printing step is followed by a curing step. Following this, the foil material is inverted and subjected to a second printing step in which the under side of the foil material is provided with printed conductors. In this step, compound 17 will again flow into apertures 4, the result being that the two printing steps serve to provide through-contacts in a reliable and extremely simple manner. As will be seen in FIGS. 4a, 4b and 4c, whether only the peripheral parts of the apertures or the entire apertures are occupied by compound 17 depends, among other things, on the diameter of apertures 4. This second printing step is followed by another curing step serving to complete the manufacturing process.

Figure 1:
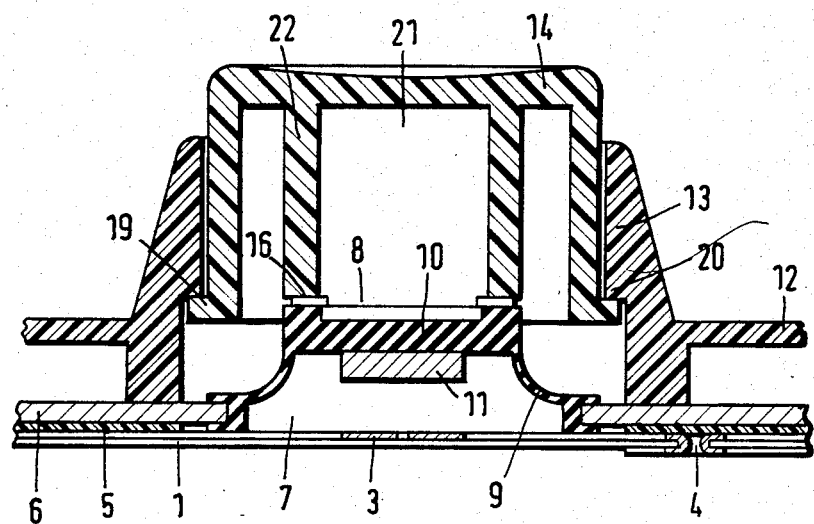
FIG. 1 shows a fragmentary cross section of a keyboard according to the invention.
Figure 2:
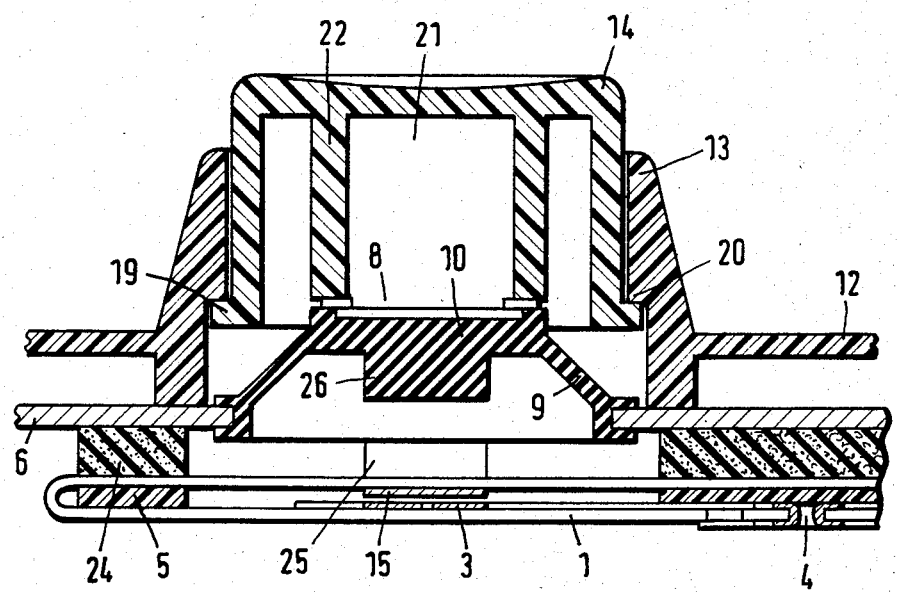
FIG. 2 shows a fragmentary cross section of another embodiment of the invention.
Figure 3:
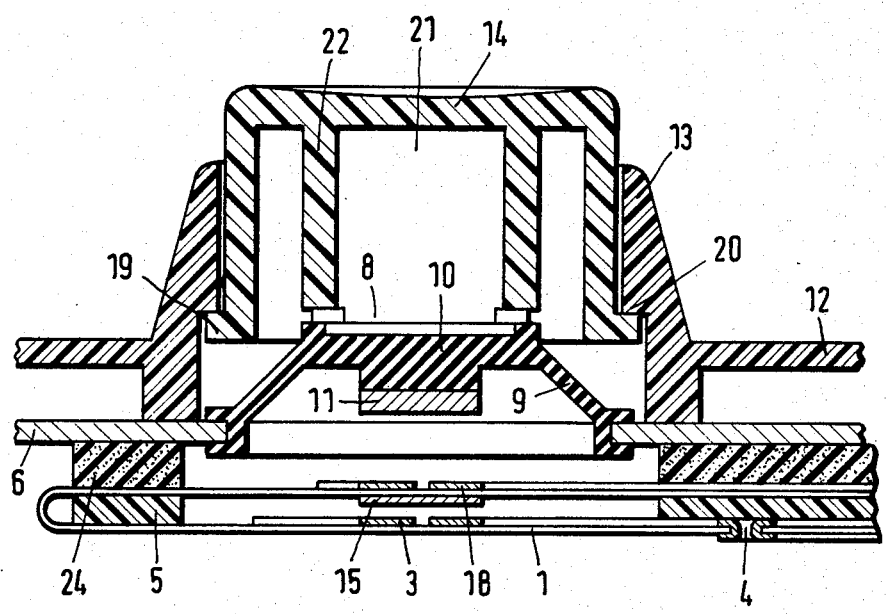
FIG. 3 shows a fragmentary cross section of still another embodiment.

As seen in FIG. 2, an insulating sheet or plate 5 is disposed above insulating foil mat 1 provided with printed conductors and contact surfaces. This sheet 5 is provided with openings or cutouts in which the first contact surfaces 3 are located. Disposed on this insulating sheet 5 is a metallic frame 6 which is provided with apertures 7 (FIG. 1) which correspond to the actuating buttons. Each of these apertures contains a snap-action element 8 which is preferably of circular shape. As seen in FIG. 1, each snap-action element is made of a rubberlike elastic material, preferably of silicone rubber, and is provided with an arcuate peripheral portion 9 which may be of concave of convex shape or, as shown in FIGS. 2 and 3, be of frustoconical shape; in addition, a substantially flat upper section 10 is provided which may be planar or recessed. The function of the snap-action element 8 resembles that of a toggle arrangement. During manufacture, all snap-action elements are integrated into the metallic frame 6 by an injection molding operation. The material forming the snap-action elements 8 is injected in such a manner that the apertures 7 are completely closed or sealed by said elements. As will be discussed below, this sealing requires that means be provided for escape of air when the internal volume of the snap-action elements 8 is reduced by pressing of the corresponding button 14.

In the embodiment shown in FIG. 1, the under side of snap-action element 8 is provided with a first contact element 11 made of an electrically conductive material, preferably of electrically conducting silicone rubber; upon the button 14 being depressed, said contact element 11 will prove an electric connection between the associated first contact surfaces 3. This contact element 11 may be prefabricated, e.g. by punching. Prior to the injection step, the contact element may be inserted into the mold in a recess provided for this purpose, and it may be connected to the injected silicone rubber by means of a vulcanizing step or by subsequently adhering it to the snap-action element. It would also be possible to consider the application of a two-stage injection method for the purpose of manufacturing and mounting the electrically conductive contact element.

Disposed above metallic frame 6 is a cover plate 12 which may be made of metal or a plastic material. Said cover plate is provided with a plurality of retaining legs (not shown) which extend in a lateral direction, for example at right angles, and are adapted to extend through the flexible-foil printed circuit and, if desired, through metallic frame 6 and insulating sheet 5, the projecting ends being twisted or welded thermoplastically or in some other suitable manner so as to be permanently retained. Cover plate 12 is provided with a plurality of sleeve-like retaining portions 13 made of a plastic material, the number of portions 13 corresponding to the number of the press buttons, said retaining portions being either integrally molded with the cover plate or snapped into position. In the event that the cover plate is made of a plastic material, said retaining portions 13 may be integrally molded with the cover plate.

Each retaining portion 13 serves to guide an actuating button 14 associated therewith. The upper faces of the actuating buttons may be provided with symbols or indicia. The lower end of each actuating button is provided with an integral projection 19 which extends around the entire periphery or part thereof and which is adapted to cooperate with a corresponding shoulder 20 with which the retaining portion is provided. This arrangement serves to prevent the actuating button from falling out of retaining portion 13. A sleeve-like projection 22 extends from the inner surface of each actuating button. The lower end of the sleeve 22 of the actuating button bears against the snap-action element 8. For the purpose of permitting airflow for pressure equalization upon pressing button 14, the end face of wall 22 is provided with a number of peripherally spaced recesses 16.

The edges of apertures 7 provided in metallic frame 6 may be of smooth shape or may be provided on both sides with small chamfers which are surrounded by the adjacent rim portion of the snap-action element 8. This arrangement provides a positive connection between the metallic frame and the snap-action element so that the forces occurring during operation will be absorbed by these mechanical retaining means, this arrangement making it possible to dispense with adhesively adhering the snap-action element to the metal frame.

Another embodiment of a keyboard according to the invention is shown in FIG. 2. Except as mentioned, the embodiment of FIG. 2 corresponds to the embodiment of FIG. 1. On one side of a flexible insulating foil sheet 1 there are disposed first contact surfaces 3, printed conductors 2 and second contact elements 15 made by means of a silk-screen printing step. The other side of foil sheet 1 is provided with printed conductors only. Said printed circuit is folded in such a manner that the second contact elements 15 are disposed above the first contact surfaces 3. The desired spacing is provided by means of insulating plate 5 or an insulating foil sheet. Disposed between metallic frame 6 and the folded foil of the printed circuit is a spacer plate 24 or a foil sheet provided with the required apertures.

The apertures in spacer plate 24 are interconnected by channels or grooves in order to permit equalization of air pressures when the buttons 14 are depressed. The first contact element 11 of the embodiment of FIG. 1 is replaced in that of FIG. 2 by a downward projection 26 provided on the under side of the snap-action element and integrally formed therewith of the same material. When actuating button 14 is depressed, projection 26 will cause the second contact element 15 to bear against the first contact surfaces 3 so as to provide electrical connection.

FIG. 3 shows still another embodiment of a keyboard according to the invention in which one side of the flexible-foil printed circuit is provided, by means of a silk-screen printing step, with first contact surfaces 3, printed conductors and second contact elements 15. The other side of the printed circuit is also provided with printed conductors and, in addition, with second contact surfaces 18. The printed circuit 1 is folded in such a manner that first and second contact surfaces and second contact elements are disposed above one another. In addition, an insulating plate 5 or a foil sheet and a spacer plate 24 are provided. In other respects, the embodiment of FIG. 3 corresponds to that shown in FIG. 1, that is to say, the under side of the snap-action element 8 is provided with a first contact element 11. Upon the actuating button being depressed, the first contact element 11 will first be brought into contact with the second contact surfaces 18. Upon actuating button 14 being depressed further, the second contact element 15 will also be caused to come into contact with the first contact surfaces 3. Thus, this arrangement makes it possible in a simple manner to provide two successive switching operations.

Figure 5:
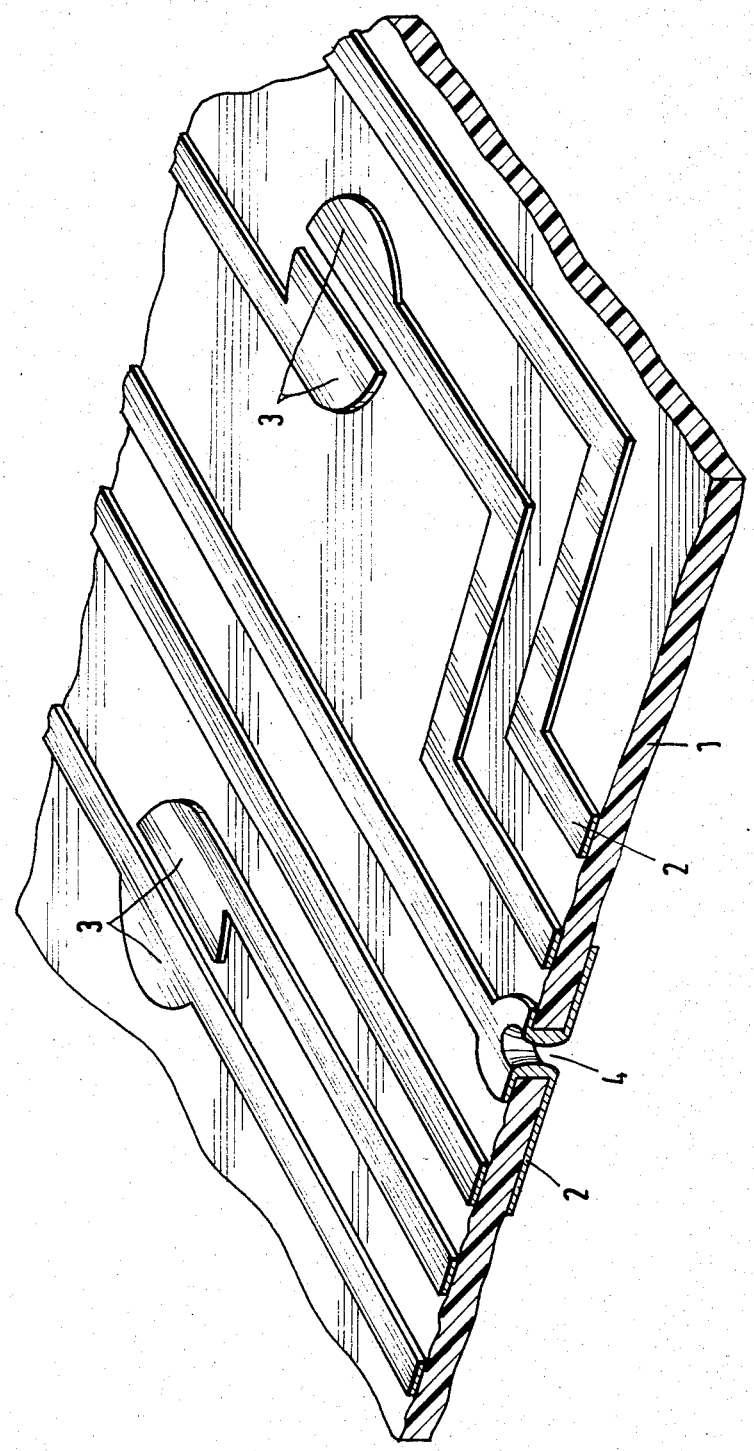
FIG. 5 shows a perspective fragmentary view of a flexible-foil printed circuit according to the invention.

FIG. 5 is a perspective fragmentary illustration of a flexible-foil printed circuit. In this case, contact surfaces 3 are of semicircular shape. Said contact surfaces may, of course, be given any desired different shape, and various geometrical arrangements are possible, such as, for example, interdigitated comb-like surfaces.

Figure 6:
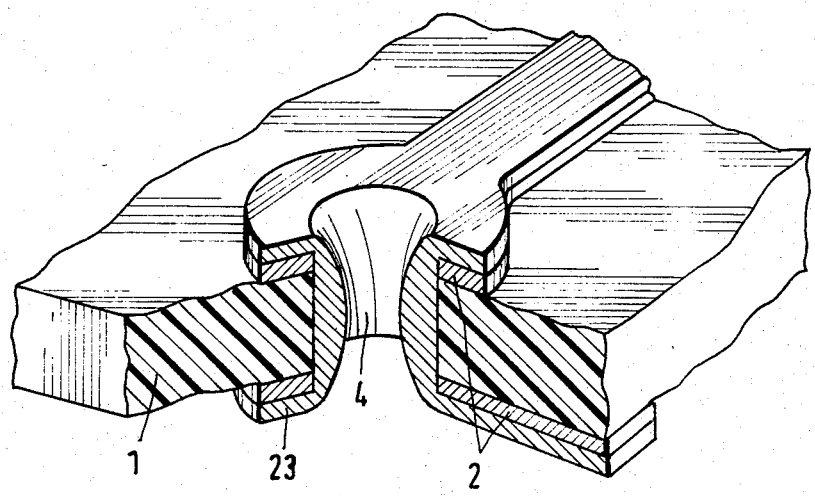
FIG. 6 shows a perspective broken-away fragmentary view of another flexible-foil printed circuit.

In the embodiments described above, the printed conductors and the contact surfaces are made of a compound 17 of good electric conductivity chosen to be suitable for application by means of a silk-screen printing step, for example a low-resistance silver compound. FIG. 6 shows another embodiment in which the conductor pattern 2 has first been applied to the flexible-foil sheet 1 by applying a low-resistance compound, e.g. a silver compound, or another metallic material such as copper, aluminum or nickel, providing good electric conductivity. This step may be performed with the aid of a silk-screen printing step only, or the printed conductors may be made by means of any of the well-known additive, semi-additive or subtractive methods. This first layer has printed thereon a second layer 23, the material of which may have a somewhat higher resistance and may have the properties of a resistive layer. In this case, the nature of layer 23 is such that, in the manner shown in FIGS. 4a, 4b and 4c, the apertures 4 are completely or partly filled with said material, this arrangement permitting through-contacts to be provided in an extremely simple manner.

The employment of a layer consisting of a material having a higher resistance affords the advantage that it is possible, particularly as regards the contact surfaces, to substitute such a relatively inexpensive layer for an expensive noble metal. The conductivity of the printed conductors is primarily determined by the low-resistance layer forming the first layer applied to the flexible foil sheet. An additional advantage resides in the fact that it is possible, by means of the same printing step, to provide resistive layers between predetermined printed conductors.

Figure 7:
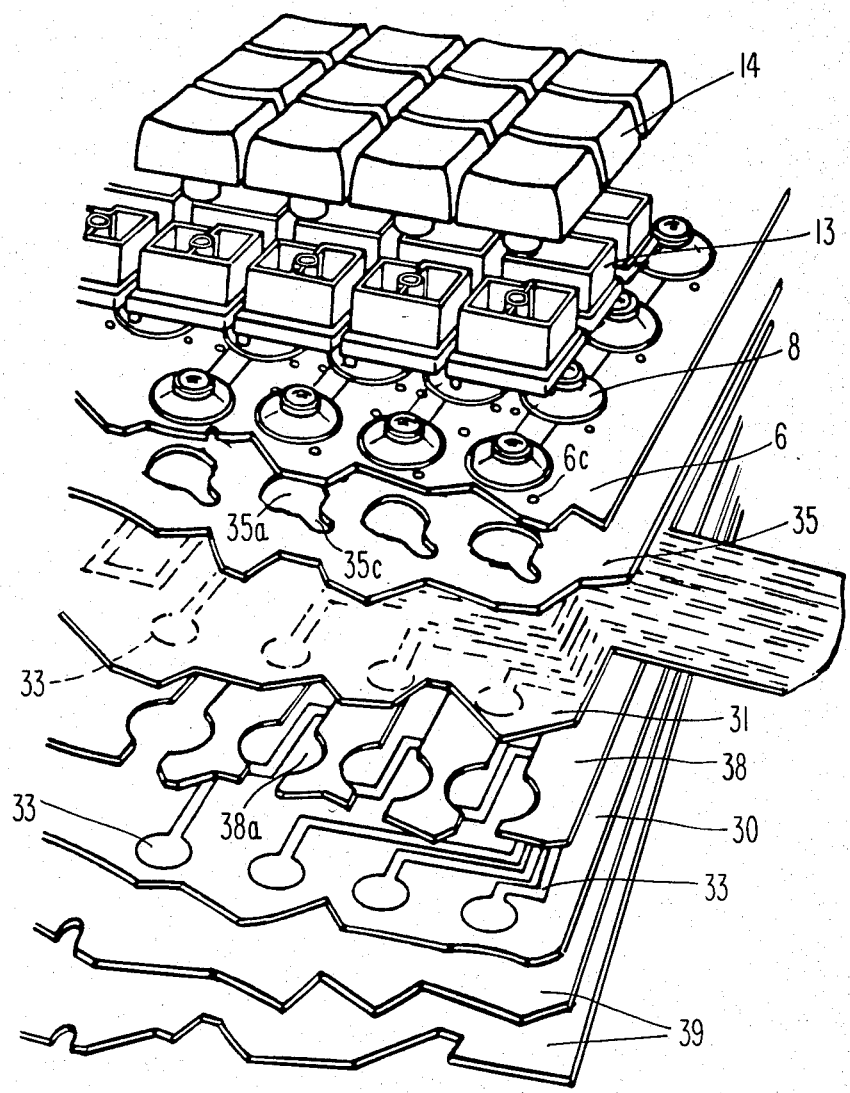
FIG. 7 shows an exploded perspective view of another embodiment of the keyboard according to the invention.
Figure 8:
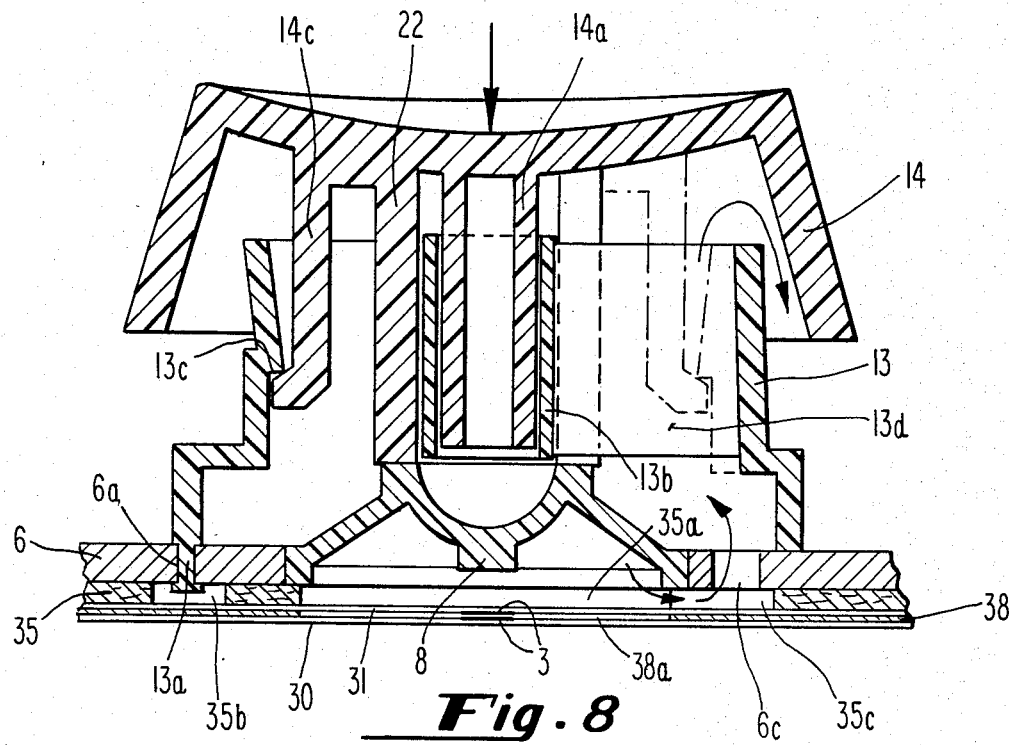
FIG. 8 shows a cross-sectional view taken through one of the keys of the keyboard of FIG. 7 and the associated structure.

FIGS. 7 and 8 show a somewhat different embodiment of the invention. A plurality of keys 14 are assembled into guide structures 13. The guide structures are provided with pins 13a which extend through apertures 6a in the metal plate 6. They can be staked or otherwise deformed or adhesively bonded to the metal plates so as to be retained therein. Each key 14 comprises a generally cylindrical tubular portion 22 extending away from the top surface of the key 14 and adapted to contact the snap-action element 8 upon depressing of the key 14. The portion 22 is divided into two halves which are separated to fit around a web portion 13d of the guide member 13, which supports a tubular guide member 13b. Each key 14 also comprises a second cylindrical central portion 14a which slides within the correspondingly-shaped tubular guide structure 13b formed in the guide member 13, so as to insure that the key slides on an axis substantially perpendicular to the metallic keyboard base member 6. Each key additionally comprises retaining tabs 14c which are shaped to interfit with internal ledges 13c formed on the internal surface of the guide member 13.

Two or more layers of flexible insulating material or foils 30 and 31 are disposed beneath the snap-action elements 8. They may have printed conductors 3 formed as discussed above, on opposing areas thereof, so as to be brought into conductive contact with one other upon depressing of the key 14.

An insulative spacer plate 35 is interposed between the metallic support plate 6 and the uppermost of the insulating foils 31. It is provided with a number of through holes in it. Larger through holes 35a permit passage of the portion of the snap-action element 8, so as to contact the uppermost of the insulating foils 31. Smaller holes 35b provide room in which the staked-over portions 13a of the guide member 13 fit. The larger holes 35a may have an extended portion 35c mating with a hole 6c in the metallic plate. There is thus provided a passage for airflow as shown by the arrows from within the snap-action element 8, upwardly into the internal portion of the guide member 13, and out from under the key, as required to permit proper operation of the snap-action element upon depressing of the key 14. Spacing of the two foil layers 30, 31 having conductors 3 printed thereon is maintained by a spacer member 38, which is punched to form holes 38a, through which the connection between the opposed conductors 3 is made upon depressing of the key 14. The underside of the entire assembly of FIG. 8 can be protected by additional plastic layers shown at 39 in FIG. 7.

There has been described a way in which a keyboard can be made extremely inexpensively yet with a high degree of reliability in operation, due to the simplified nature and reduced number of the mechanical operations used to manufacture its various constituent parts.

While a preferred embodiment of the invention has been shown and described, the invention should not be limited thereby, but only by the following claims:

What is claimed is:

1. A keyboard assembly comprising a number of movable keys, each of said keys being movably retained in juxtaposition to unitary molded snap-action elements sealed to a metallic support member and to a pair of conductors mounted on flexible substrates in close juxtaposition to one another and aligned with said snap-action elements, such that upon depression of one of said keys, the corresponding snap-action element urges one of the corresponding pair of conductors into contact with the other, said assembly comprising a spacer sheet interposed between said flexible substrates and having holes punched therethrough to permit one of said pair of conductors to contact the other, wherein a hole is formed in said metallic support member in the region under each of said keys, the periphery of each of said keys being open to the atmosphere, whereby air is not confined under said unitary snap-action elements sealed to said metallic plate.

2. The keyboard of claim 1 wherein each of the holes provided in said spacer sheet through which the contact between said conductors on said flexible substrates is made further comprises a passage for air communication.

3. The keyboard of claim 1 wherein said movably retained keys are mounted on a key support member, said key support member comprising pins fitting into additional holes in said metal substrate for retention at locations juxtaposed to said snap-action elements.

4. The keyboard of claim 3 wherein each said key comprises concentric cylinders, the inner of said cylinders interfitting with a tubular support member formed in said key support member for sliding relative thereto along the axis of said cylinders, and the outer of said cylinders being adapted to contact a contact surface on said snap-action member upon depression of said key.

5. The keyboard according to claim 4 wherein said cylinders are molded as one piece with said key member.

6. The keyboard of claim 5 wherein said key member additionally comprises retaining tab means for interaction with retaining detent means formed in said key support member.

* * * * *